United States Patent [19]

Abrahams et al.

[11] 4,279,688

[45] Jul. 21, 1981

[54] METHOD OF IMPROVING SILICON CRYSTAL PERFECTION IN SILICON ON SAPPHIRE DEVICES

[75] Inventors: Marvin S. Abrahams, Cranbury; Joseph Blanc, Princeton, both of N.J.

[73] Assignee: RCA Corporation, New York, N.Y.

[21] Appl. No.: 131,046

[22] Filed: Mar. 17, 1980

[51] Int. Cl.[3] .................... C30B 25/02; C30B 29/06

[52] U.S. Cl. .................................. 156/613; 148/175; 156/DIG. 64; 423/349; 427/95

[58] Field of Search ............... 156/610, 613, DIG. 73, 156/DIG. 64; 148/175; 423/349; 427/86, 95

[56] References Cited

U.S. PATENT DOCUMENTS

| | | | |
|---|---|---|---|
| 3,413,145 | 11/1968 | Robinson et al. | 156/613 |
| 3,496,037 | 2/1970 | Jackson, Jr. et al. | 156/613 |
| 3,508,962 | 4/1970 | Manasevit et al. | 156/613 |
| 3,847,686 | 11/1974 | Stein | 148/175 |
| 3,862,859 | 1/1975 | Ettenberg et al. | 148/175 |
| 3,885,061 | 5/1975 | Corboy et al. | 156/613 |
| 4,174,422 | 11/1979 | Matthews et al. | 156/613 |

OTHER PUBLICATIONS

Abrahams et al., "Early Growth of Silicon on Sapphire", Dec. 1976, published in J. of Applied Physics, vol 47, 12, pp. 5139-5151.

Chaudhari et al., "Annealing to Fill Cracks in Thin Films", Feb. 1973 published in IBM Tech. Disclosure Bull., vol 15, #9, p. 2697.

*Primary Examiner*—Frank W. Lutter
*Assistant Examiner*—Gregory N. Clements
*Attorney, Agent, or Firm*—Birgit E. Morris; D. S. Cohen; Lawrence P. Benjamin

[57] ABSTRACT

A process for forming a relatively defect free layer of silicon on an insulating substrate wherein as soon as growth islands are formed on the substrate, to a point just prior to the complete coverage of the substrate with silicon, the formation of the layer is temporarily terminated. The growth islands are maintained at a given temperature for a predetermined period, to allow any defects, which may have started during the initial formation of the growth island, to be self-cured or to annihilate themselves. Thereafter, the growth of silicon is continued until the desired layer thickness is achieved.

8 Claims, 4 Drawing Figures

METHOD OF IMPROVING SILICON CRYSTAL PERFECTION IN SILICON ON SAPPHIRE DEVICES

BACKGROUND OF THE INVENTION

This invention relates to semiconductor processing and more particularly to a method of improving the crystalline perfection of a layer of monocrystalline silicon epitaxially deposited on an insulating substrate.

It has long been known that the semiconducting properties of an epitaxially deposited layer of silicon in both MOS and bipolar device structures, fabricated on an insulative substrate, is closely related to both the chemical and crystallographic nature of the silicon-substrate interface. The nature of the interface is a function of both the condition of the single crystalline nature of the substrate exposed to the deposition atmosphere and the variables involved in the heteroepitaxial growth process of the silicon film. The properties specific to the thin silicon film grown on the insulative substrate are largely determined by the contamination of the silicon film as a result of reactions with the insulative substrate which take place during the period immediately prior to the complete coverage of the substrate surface.

Detailed examinations of, for example, (100) silicon deposited on a $(01\bar{1}2)$ sapphire will show the presence of defects such as stacking faults and microtwins all of which contribute to increased leakage currents and decreased mobilities in the silicon film in its final, fabricated form. One attempt to improve the deposition technique and to minimize any auto doping of the silicon film at the silicon-insulating substrate interface has been detailed in U.S. Pat. No. 3,885,061, which issued on May 20, 1975 to J. F. Corboy et al. and entitled "Dual Growth Rate Method of Depositing Epitaxial Crystalline Lines." This reference teaches the deposition of a film in two stages, the first stage being the deposition of a very thin film (500–2000 Angstroms) using a "burst" technique followed by the deposition of the remainder of the film at a slower rate until the desired thickness is reached. While the process of this reference does, in fact, produce fewer defects and faults in the deposited silicon layer, it does not address itself to or attempt to cure those defects or faults that are generated in the growth islands when the initial burst produces the individual growth islands.

SUMMARY OF THE INVENTION

A novel process is described for forming a relatively defect free, epitaxially grown layer of silicon on a sapphire substrate which includes the initial step of forming growth islands on an insulative substrate to a point just prior to the complete coverage of the substrate with silicon, annealing the growth islands for a predetermined period to allow the defects to annihilate themselves and thereafter continuing the growth of the silicon until the desired thickness is reached.

DETAILED DESCRIPTION OF THE PROCESS

While the foregoing exegesis will be presented in terms of using sapphire as the insulative substrate or carrier for the epitaxial growth of a silicon film, we do not wish to be so limited. Those skilled in the art will readily recognize that when the expression "sapphire" or "silicon-on-sapphire" (SOS) appears, it is also meant to include the use of such other materials as spinel or gallium phosphide as the substrate.

The initial steps in the practice of our invention start with the proper preparation of the substrate in order to facilitate the most favorable conditions for the growth of sufficiently high quality epitaxial layer of silicon so as to be able to manufacture a commercially successful microelectronic device. The usual practice consists of growing a good quality sapphire either in a boule and thereafter slicing and polishing the surface or, in the alternative, the sapphire may be an edge defined, film-fed growth which involves pulling a continuous ribbon of sapphire from a shaping dye. In any event, these or any one of many other well known techniques may be used for the production of a sapphire substrate, all of which are well known to those skilled in the art. If necessary, the substrate is polished or otherwise prepared for the deposition of a layer of epitaxially grown silicon by annealing to relieve any stresses that may have been introduced therein during its formation.

The next step is to place the sapphire substrate in an appropriate reaction chamber and raise the temperature therein to about 1000° C. Thereafter, while maintaining the substrate at about 1000° C., a mixture of silane ($SiH_4$) and hydrogen ($H_2$) is introduced into the chamber in such proportions as to achieve a silicon growth rate of about 0.4 micron/min. This silicon film growth is continued for a period of about 1–3 seconds.

Figure 1:
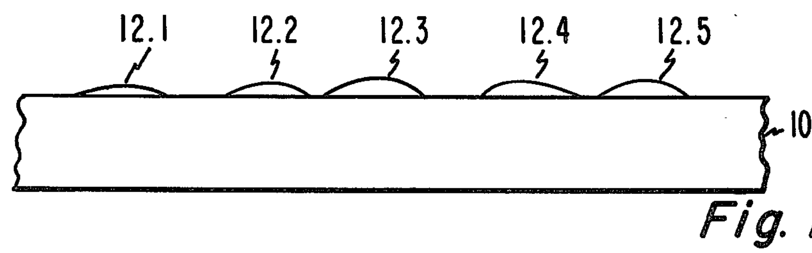
FIGS. 1-4 are cross sectional views of early silicon film growth on an insulative substrate which schematically illustrates the manner in which a silicon film is epitaxially formed.

FIG. 1 depicts the epitaxial growth of silicon on sapphire substrate 10 during the very beginnings of the formation of the silicon layer. Growth islands 12.1–12.5 are usually randomly formed on substrate 10 and have not grown sufficiently laterally to coalesce or grow together with the next adjacent growth island.

Figure 2:
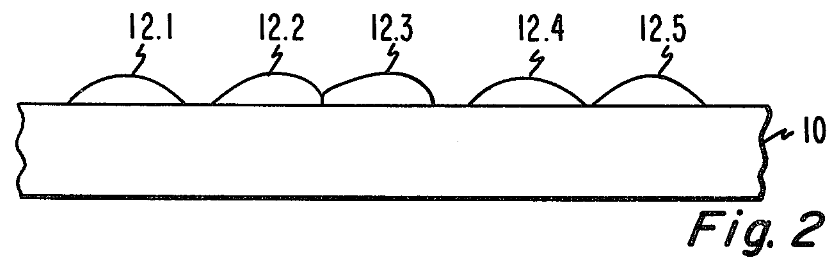

FIG. 2 represents a period of time, of the order of about 1 second after the onset of processing, when there has been little coalescing of adjacent islands, such as illustrated by islands 12.2 and 12.3. What is preferred is that the islands be allowed to grow in the manner illustrated by islands 12.4 and 12.5, that is, to the point where they only just abut. However, it should be understood that any coalescing of islands up to about 90% of the islands 12.1–12.5 can be tolerated. At this stage, islands 12.1–12.5 will have a mean diameter of about 1400–1500 Angstroms and a minimum height or thickness of about 300–500 Angstroms.

At this point in time, the next step is taken which step takes the form of terminating the exposure of the structure to the $SiH_4/H_2$ mixture by cutting off the flow thereof and maintaining the structure at the growth temperature of about 1000° C. for a sufficient period of time to allow any crystallographic misorientation or defects (stacking faults and microtwinning) that may have started in any of the growth islands to be self-cured. In the example described above, using a growth temperature of about 1000° C. and an initial growth rate of silicon of about 0.4 micron/min., we have found that a curing time of about two minutes is sufficient for the defects to become annihilated or cured.

After the curing step, the flow of $SiH_4$ and $H_2$ is restarted and the epitaxial growth of silicon is continued at whatever rate is desired. In this example, a growth rate of about 2.0 microns/min. is utilized for the second growth and continued until the desired thickness of silicon is achieved. Typically, the finished thickness for an SOS device is about 0.6 micrometer.

Figure 3:
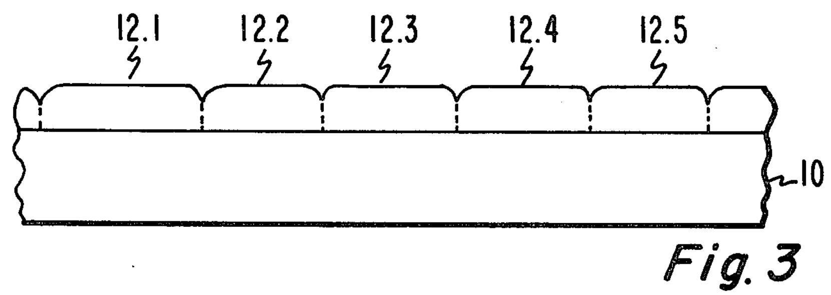
Figure 4:
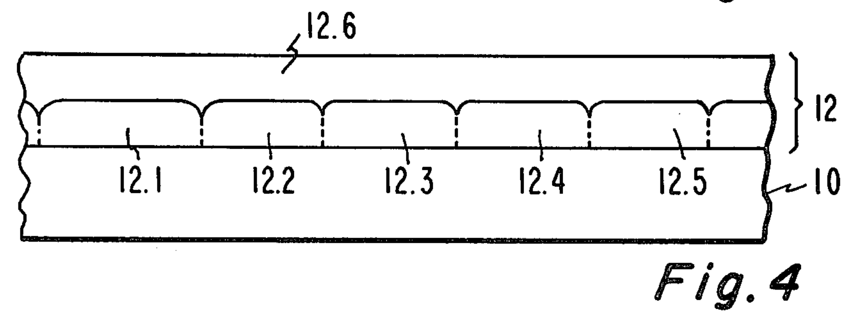

Soon after restarting the $SiH_4/H_2$ flow, all of the silicon growth islands 12.1–12.5 have coalesced and growth together as shown in FIG. 3. When the processing is continued, as shown in FIG. 4, silicon layer 12.6 forms over the now coalesced sublayer 12.1–12.5, the combination forming epitaxially grown silicon layer 12.

Thus, we have presented a method of forming an epitaxially grown layer of monocrystalline silicon having fewer defects than heretofore possible by curing the defects almost as soon as they are developed. This is done by means of a heat treatment before the defects have had the chance to increase in size and before the defects have had a chance to affect any subsequently grown silicon.

What is claimed is:

1. A method of improving crystalline silicon perfection comprising the steps of:
(a) providing an insulating substrate;
(b) initially depositing a discontinuous layer of crystalline silicon on the substrate at a given growth temperature, the layer characterized by the formation of discrete growth islands of crystalline silicon;
(c) terminating the deposition of the crystalline silicon;
(d) maintaining the substrate and growth islands at the given growth temperature for a given period of time to cure any crystallographic misorientations and defects that may have been formed in the silicon islands; and
(e) depositing silicon on the now cured islands and on the substrate.

2. The article of manufacture formed by the method of claim 1.

3. The method of claim 1, wherein step (a) comprises: selecting the insulating substrate from the group consisting of sapphire, spinel and gallium phosphide.

4. The article of manufacture formed by the method of claim 3.

5. The method of claim 3, wherein step (b) comprises: depositing the discontinuous layer of silicon at the rate of about 0.4 micron per minute for a period of about 1–3 seconds at a given growth temperature of about 1000° C.

6. The article of manufacture formed by the method of claim 5.

7. The method of claim 5, wherein in step (d): the temperature of the substrate and growth islands is maintained at the given growth temperature for a period of about two minutes after terminating the deposition of silicon.

8. The article of manufacture formed by the method of claim 7.

* * * * *